United States Patent
Kang et al.

(10) Patent No.: US 10,147,581 B2
(45) Date of Patent: Dec. 4, 2018

(54) X-RAY TUBE INCLUDING HYBRID ELECTRON EMISSION SOURCE

(71) Applicant: ELECTRONICS AND TELECOMMUNICATIONS RESEARCH INSTITUTE, Daejeon (KR)

(72) Inventors: Jun Tae Kang, Daejeon (KR); Yoon-Ho Song, Daejeon (KR); Jae-Woo Kim, Daejeon (KR); Jin-Woo Jeong, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 213 days.

(21) Appl. No.: 15/233,198

(22) Filed: Aug. 10, 2016

(65) Prior Publication Data

US 2017/0213685 A1 Jul. 27, 2017

(30) Foreign Application Priority Data

Jan. 26, 2016 (KR) .................. 10-2016-0009304
Jul. 11, 2016 (KR) .................. 10-2016-0087736

(51) Int. Cl.
*H01J 7/18* (2006.01)
*H01J 19/48* (2006.01)
(Continued)

(52) U.S. Cl.
CPC ............. *H01J 37/063* (2013.01); *H01J 7/18* (2013.01); *H01J 19/48* (2013.01); *H01J 21/20* (2013.01);
(Continued)

(58) Field of Classification Search
CPC .......... A61B 6/00; A61B 6/40; A61B 6/4007; A61B 2560/00; A61B 2560/04; H05G 1/00; H05G 1/02; H05G 1/56; H01J 1/00; H01J 1/02; H01J 1/13; H01J 1/30; H01J 1/304; H01J 3/00; H01J 3/02; H01J 3/021; H01J 3/024; H01J 3/027; H01J 3/38; H01J 3/40;
(Continued)

(56) References Cited

U.S. PATENT DOCUMENTS 5,729,583 A * 3/1998 Tang ................ A61B 6/145
378/122
7,638,933 B2 * 12/2009 Jiang ................ H01J 1/14
313/310

(Continued)

FOREIGN PATENT DOCUMENTS

KR 10-1097722 B1 12/2011

*Primary Examiner* — Anastasia Midkiff

(57) ABSTRACT

Disclosed is an x-ray tube including a hybrid electron emission source, which uses, as an electron emission source, a cathode including both a field electron emission source and a thermal electron emission source. An x-ray tube includes an electron emission source emitting an electron beam, and a target part including a target material that emits an x-ray as the emitted electron beam collides with the target part, wherein the electron emission source includes a thermal electron emission source and a field electron emission source, and emits the electron beam by selectively using at least one of the thermal electron emission source and the field electron emission source.

16 Claims, 2 Drawing Sheets

(51) Int. Cl.
*H01J 21/20* (2006.01)
*H01J 29/50* (2006.01)
*H01J 35/16* (2006.01)
*H01J 35/20* (2006.01)
*H01J 37/06* (2006.01)
*H01J 37/063* (2006.01)
*H01J 29/48* (2006.01)
*H01J 35/06* (2006.01)
*H01J 9/39* (2006.01)
*H01J 29/46* (2006.01)

(52) U.S. Cl.
CPC ............ *H01J 29/488* (2013.01); *H01J 29/50* (2013.01); *H01J 35/20* (2013.01); *H01J 7/186* (2013.01); *H01J 9/39* (2013.01); *H01J 29/46* (2013.01); *H01J 35/06* (2013.01); *H01J 35/065* (2013.01); *H01J 35/165* (2013.01); *H01J 2201/196* (2013.01); *H01J 2201/317* (2013.01); *H01J 2209/385* (2013.01); *H01J 2209/3893* (2013.01); *H01J 2229/4827* (2013.01); *H01J 2229/4831* (2013.01); *H01J 2229/94* (2013.01); *H01J 2235/068* (2013.01); *H01J 2235/205* (2013.01); *H01J 2237/032* (2013.01); *H01J 2237/036* (2013.01); *H01J 2237/06375* (2013.01); *H01J 2237/1825* (2013.01)

(58) Field of Classification Search
CPC ........ H01J 7/00; H01J 7/14; H01J 7/16; H01J 7/18; H01J 7/183; H01J 7/186; H01J 7/44; H01J 19/00; H01J 19/02; H01J 19/04; H01J 19/24; H01J 19/42; H01J 19/46; H01J 19/48; H01J 19/10; H01J 19/12; H01J 19/70; H01J 19/72; H01J 19/78; H01J 21/00; H01J 21/20; H01J 31/00; H01J 31/0204; H01J 9/38; H01J 9/385; H01J 9/39; H01J 29/00; H01J 29/02; H01J 29/04; H01J 29/46; H01J 29/48; H01J 29/481; H01J 29/484; H01J 29/485; H01J 29/488; H01J 29/50; H01J 29/82; H01J 29/84; H01J 29/96; H01J 35/00; H01J 35/02; H01J 35/025; H01J 35/04; H01J 35/06; H01J 35/065; H01J 35/16; H01J 35/165; H01J 35/20; H01J 37/00; H01J 37/02; H01J 37/04; H01J 37/06; H01J 37/063; H01J 37/065; H01J 37/073; H01J 37/075; H01J 37/24; H01J 37/30; H01J 37/3002; H01J 37/302; H01J 37/3023; H01J 37/3026; H01J 2201/00; H01J 2201/02; H01J 2201/19; H01J 2201/196; H01J 2201/304; H01J 2201/317; H01J 2203/00; H01J 2203/02; H01J 2203/0204; H01J 2209/00; H01J 2209/02; H01J 2209/022; H01J 2209/0223; H01J 2209/38; H01J 2209/383; H01J 2209/385; H01J 2209/389; H01J 2209/3893; H01J 2229/00; H01J 2229/48; H01J 2229/4803; H01J 2229/4806; H01J 2229/4824; H01J 2229/4827; H01J 2229/4831; H01J 2229/94; H01J 2229/96; H01J 2235/00; H01J 2235/06; H01J 2235/062; H01J 2235/068; H01J 2235/20; H01J 2235/205; H01J 2237/00; H01J 2237/02; H01J 2237/03; H01J 2237/032; H01J 2237/036; H01J 2237/06; H01J 2237/063; H01J 2237/06308; H01J 2237/06341; H01J 2237/0635; H01J 2237/06375; H01J 2237/18; H01J 2237/182; H01J 2237/1825

See application file for complete search history.

(56) References Cited

U.S. PATENT DOCUMENTS

| 2006/0124958 | A1* | 6/2006 | Cox ..................... B82Y 10/00 257/109 |
| 2013/0028386 | A1 | 1/2013 | Jeong et al. |
| 2013/0162134 | A1* | 6/2013 | Mattausch ............. H01J 3/025 313/33 |
| 2013/0336459 | A1 | 12/2013 | Choi et al. |

* cited by examiner

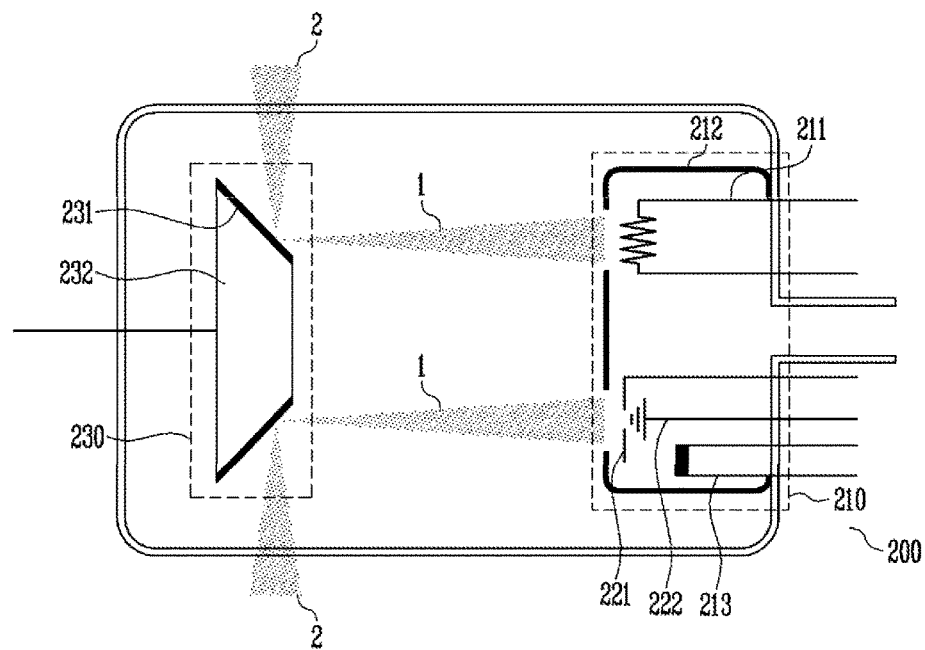
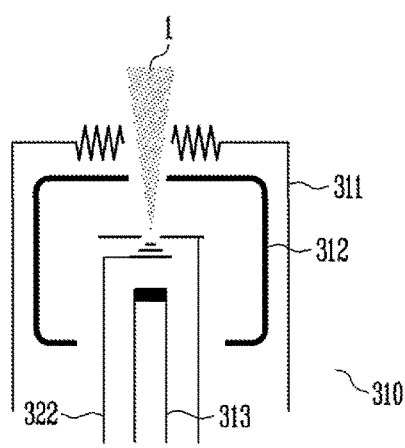
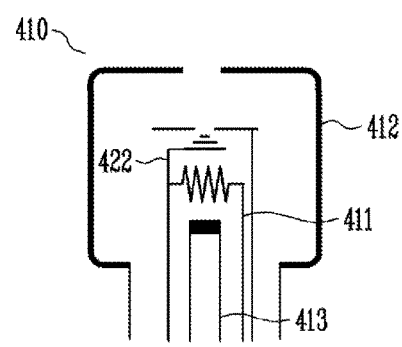

X-RAY TUBE INCLUDING HYBRID ELECTRON EMISSION SOURCE

CROSS-REFERENCE TO RELATED APPLICATIONS

The present application claims priority to Korean Patent Application Numbers 10-2016-0009304 filed on Jan. 26, 2016 and 10-2016-0087736 filed on Jul. 11, 2016, in the Korean Intellectual Property Office, the entire disclosure of which is incorporated by reference herein.

BACKGROUND

1. Field

An aspect of the present disclosure relates to an x-ray tube including a hybrid electron emission source, and more particularly, to an x-ray tube using, as an electron emission source, a cathode including both a field electron emission source and a thermal electron emission source.

2. Description of the Related Art

A principle of emitting electrons is largely divided into thermal electron emission and field electron emission.

In the above-described principle, a thermal electron emission scheme that heats a filament in a vacuum glass tube is most frequently used for x-ray tubes. However, x-ray tubes using a field electron emission scheme that easily performs digital control have recently been researched and developed.

Field electron emission sources can use various kinds of materials such as metal tips, carbon nanotubes, and nanowires. Also, the field electron emission sources easily perform digital control, and hence unnecessary exposure of x-rays can be reduced when human bodies are treated using x-ray tubes. Also, the field electron emission sources can perform high-speed scan driving, and hence high-quality resultant images can be obtained.

As interest in health increases, the time for which human bodies are exposed to x-rays or the quantity of the x-rays in not only treatment but also diagnosis, prevention, etc. has recently increased. Accordingly, studies on x-ray tubes using the field electron emission scheme having the above-described advantages have actively conducted.

Nevertheless, the field electron emission sources have a little quantity of electrons emitted therefrom while requiring a relatively high vacuum degree, as compared with thermal electron emission sources. Therefore, a method capable of solving this problem is required.

SUMMARY

Embodiments provide an x-ray tube including a hybrid electron emission source including a hybrid electron emission source including a field electron emission source and a thermal electron emission source.

Embodiments also provide a structure of an x-ray tube using a hybrid electron emission source, which can sufficiently remove outgassing (gas release, gas exhaustion) that occurs in internal components of the x-ray tube, and can prevent the degradation of a vacuum degree due to the outgassing in driving of the sealed x-ray tube.

According to an aspect of the present disclosure, there is provided an x-ray tube including: an electron emission source emitting an electron beam; and a target part including a target material that emits an x-ray as the emitted electron beam collides with the target part, wherein the electron emission source includes a thermal electron emission source and a field electron emission source, and emits the electron beam by selectively using at least one of the thermal electron emission source and the field electron emission source.

The thermal electron emission source may include: a cathode to which a coil-shape tungsten filament is connected; a focusing cup surrounding the periphery of the cathode, the focusing cup focusing an electron beam emitted from the cathode; and a getter provided in the focusing cup, the getter removing adsorbing and removing outgassing that occurs in the x-ray tube.

The field electron emission source may include: a gate electrode forming an electric field; and a cathode electrode including an emitter that emits electrons induced by the electric field.

The target part may include an anode electrode including the target material.

The field electron emission source may be disposed to share the focusing cup and the getter with the thermal electron emission source.

The field electron emission source may be disposed in the focusing cup.

The field electron emission source may be horizontally disposed with the thermal electron emission source.

The field electron emission source may be horizontally disposed with the cathode of the thermal electron emission source in the focusing cup.

The field electron emission source may be disposed under the thermal electron emission source.

The cathode may be disposed at an outside of the focusing cup. The cathode may be disposed over the field electron emission source on the basis of the focusing cup.

The field electron emission source may be disposed over the thermal electron emission source.

The cathode may be disposed under the field electron emission source in the focusing cup.

The electron beam emitted from the thermal electron emission source may collide with the target part and the cathode electrode, thereby removing outgassing of the anode electrode and the cathode electrode.

The gate electrode may allow a high current to flow in the emitter, thereby removing outgassing of the emitter.

The removal of the outgassing may be performed in a manufacturing process of the x-ray tube.

The getter may be activated before the x-ray tube is sealed, to remove outgassing that occurs during driving of the x-ray tube.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 3 is a view illustrating an operation when the x-ray tube is driven.

FIG. 4 is a view illustrating a structure of an x-ray tube according to a second embodiment of the present disclosure.

FIG. 5 is a view illustrating a structure of an x-ray tube according to a third embodiment of the present disclosure.

DETAILED DESCRIPTION

The present disclosure now will be described more fully hereinafter with reference to the accompanying drawings, in which embodiments of the present disclosure are shown. The present disclosure should not be construed as limited to the embodiments set forth herein. Rather, these embodiments are provided so that this disclosure will be thorough and complete, and will fully convey the scope of the present disclosure to those skilled in the art.

It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof.

As used herein, the singular forms are intended to include the plural forms as well, unless the context clearly indicates otherwise.

Hereinafter, exemplary embodiments of the present disclosure will be described in detail with reference to the accompanying drawings.

Figure 1:
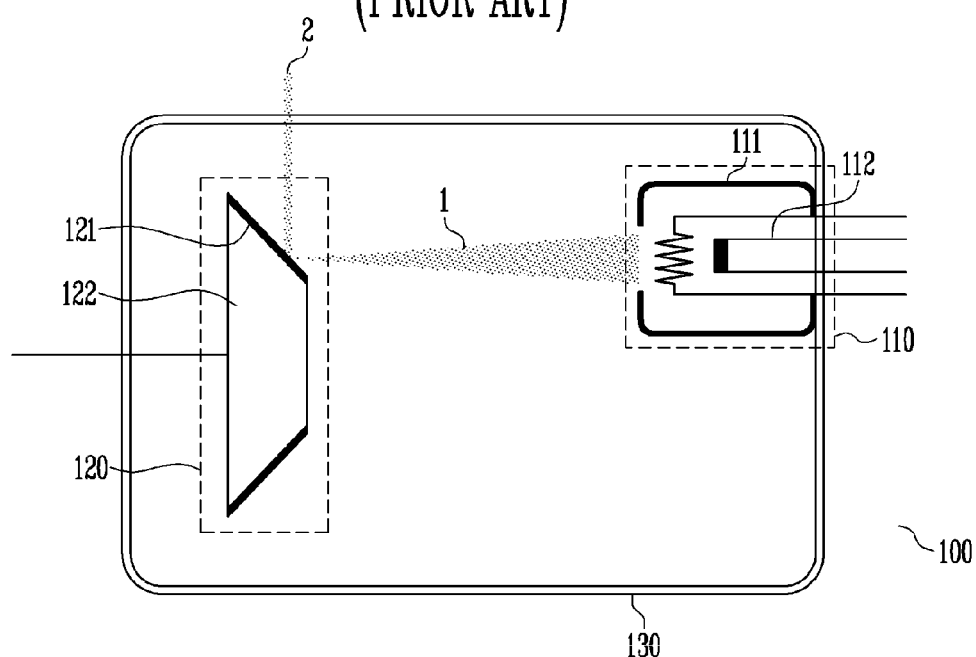
FIG. 1 is a view illustrating a structure of a general x-ray tube.

FIG. 1 is a view illustrating a structure of a general x-ray tube.

FIG. 1 illustrates a structure of a general x-ray tube 100 using a thermal electron emission source as an electron emission source. Referring to FIG. 1, the x-ray tube 100 includes a thermal electron emission source 110 and a target part 120.

The thermal electron emission source 110 emits electrons in the form of an electron beam 1 by means of thermal energy supplied thereto. The thermal electron emission source 110 may include a focusing cup 111 that focuses the electron beam 1 emitted therefrom such that the electron beam 1 is not diffused.

In various embodiments, the thermal electron emission source 110 may include a getter 112. The getter 112 is provided to remove outgassing that occurs inside the x-ray tube 100, using internal adsorption in driving of the x-ray tube 100.

The target part 120 includes an anode electrode 122 including a target material 121 that emits an x-ray 2 as the electron beam 1 emitted from the thermal electron emission source 110 collides with the target material 121.

In a manufacturing process of the x-ray tube 100, outgassing that may occur in the driving of the x-ray tube 100 can be primarily removed in advance. Specifically, the x-ray tube 100 is heated at a high temperature in a state in which it is connected to a vacuum pump through an exhaust tube, and accordingly, the electron beam 1 emitted from the thermal electron emission source 110 collides with the target material 121 of the target part 120. A gas exhausted from the target part 120 due to the collision of the electron beam 1 with the target material 121 is exhausted to the outside through the vacuum pump.

At this time, as the x-ray tube 100 is heated at a higher temperature, the outgassing is more efficiently removed.

However, a glass tube 130 forming the outer shape of the x-ray tube 100 is generally made of borosilicate-based glass having a softening temperature of about 700 to 800° C. Hence, when the outgassing is removed, the heating temperature of the x-ray tube 100 is to be lower than the softening temperature. In addition, although the x-ray tube 100 is heated from the outside to a temperature corresponding to the softening temperature of the glass tube 130, components inside the x-ray tube 100 are heated to a temperature lower than the real temperature to which the x-ray tube 100 is heated from the outside.

Due to this temperature limitation, there occurs a problem in that the outgassing is not sufficiently removed in the manufacturing process of the x-ray tube 100. If the x-ray tube 100 in which the outgassing is not sufficiently removed is driven, the vacuum degree inside the glass tube 130 is lowered by the outgassing occurring in the driving of the x-ray tube 100. Therefore, the performance and lifespan of the x-ray tube 100 are reduced.

In FIG. 1, the x-ray tube 100 using the thermal electron emission source has been described as an example, but the above-described problem identically occurs in an x-ray tube using a field electron emission source. Particularly, if the vacuum degree inside the glass tube 130 is low, the field electron emission source is rapidly degraded. Therefore, the quantity of electrons emitted from the field electron emission source is reduced, and unstable emission current characteristics are exhibited. When the vacuum degree inside the glass tube 130 is lowered, the field electron emission source has a problem in that the performance and lifespan of the x-ray tube 100 are seriously reduced due to damage caused by the generation of an arc.

In order to solve this problem, the present disclosure provides a structure of an x-ray tube, in which outgassing can be sufficiently removed in manufacturing of the x-ray tube, using a hybrid electron emission source including both a field electron emission source and a thermal electron emission source.

Figure 2:
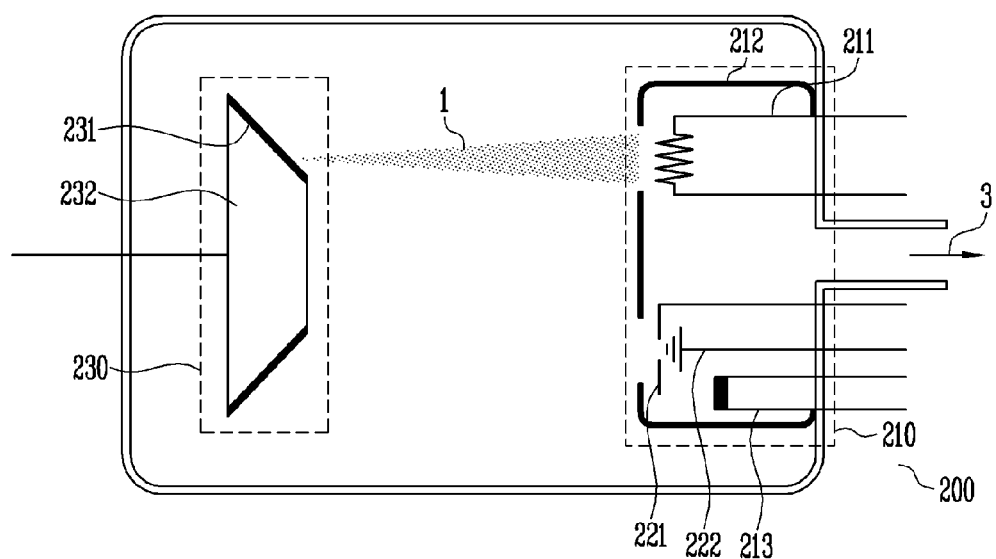
FIG. 2 is a view illustrating a structure of an x-ray tube according to a first embodiment of the present disclosure.

FIG. 2 is a view illustrating a structure of an x-ray tube according to a first embodiment of the present disclosure.

Referring to FIG. 2, the x-ray tube 200 according to the first embodiment of the present disclosure includes a hybrid electron emission source 210 including a thermal electron emission source and a field electron emission source and a target part 230.

The thermal electron emission source emits electrons in the form of an electron beam 1 by means of thermal energy supplied therefrom. The thermal electron emission source includes a cathode 211 to which a coil-shaped tungsten filament is connected, and a focusing cup 212 surrounding the periphery of the cathode 211, the focusing cup 212 focusing the electron beam 1 emitted from the cathode 211. At least one hole through which the electron beam 1 can pass is formed in the focusing cup 212.

In various embodiments, the thermal electron emission source may include a getter 213. The getter 213 is provided in the focusing cup 212, and functions to remove outgassing that occurs inside the x-ray tube 200, using internal adsorption in driving of the x-ray tube 200.

The field electron emission source emits, in the form of the electron beam 1, electrons induced by an electric field formed therein. The field electron emission source includes a gate electrode 221 for forming an electric field in the field electron emission source and a cathode electrode 222 to which an emitter for emitting electrons by means of the electric field is attached. In various embodiments, the emitter may include a carbon nanotube, etc.

The target part 230 includes an anode electrode 232 including a target material 231 that emits an x-ray as the electron beam 1 emitted from the hybrid electron emission source 210 collides with the target material 231.

In various embodiments, the hybrid electron emission source 210 including both the thermal electron emission source and the field electron emission source has the following structure.

The thermal electron emission source and the field electron emission source share the focusing cup 212 of the thermal electron emission source. To this end, the field electron emission source is disposed in the focusing cup 212 of the thermal electron emission source. As the field electron emission source is disposed in the focusing cup 212, the field electron emission source can share the getter 213 with the thermal electron emission source.

In the first embodiment of the present disclosure, the field electron emission source and the thermal electron emission source may be horizontally arranged. Specifically, the cathode 211 of the thermal electron emission source and the field electron emission source may be horizontally arranged in the focusing cup 212. That is, the cathode 211 of the thermal electron emission source is disposed together with the field electron emission source in the focusing cup 212. In this case, holes through which electron beams emitted from the field electron emission source and the thermal electron emission source respectively pass may be formed in the focusing cup 212.

However, the arrangement of the thermal electron emission source and the field electron emission source is not limited thereto, and the thermal electron emission source and the field electron emission source may be arranged in various manners such that the efficiency of the x-ray tube 200 is maximized. Various embodiments according to arrangements of the thermal electron emission source and the field electron emission source will be described in detail with reference to FIGS. 4 and 5.

As described above, the x-ray tube 200 includes the hybrid electron emission source 210 including both the thermal electron emission source and the field electron emission source, so that, as shown in FIG. 3, the electron emission sources can be selectively driven when necessary. For example, the thermal electron emission source may be driven when a high-density x-ray is required, and the field electron emission source may be driven when high-speed scanning is required.

In addition, the x-ray tube 200 has a structure in which the thermal electron emission source and the field electron emission source share the focusing cup 212 and the getter 213, so that outgassing can be efficiently removed.

Specifically, in a manufacturing process of the x-ray tube 200, the x-ray tube 200 is heated in a state in which it is connected to a vacuum pump. The electron beam 1 emitted from the heated thermal electron emission source collides with the anode electrode 232 to desorb adsorbing materials onto a surface of the target part 230, and outgassing occurring in the anode electrode 232 is discharged 3 to the outside through the vacuum pump. Thus, the outgassing is removed.

At this time, the electron beam 1 is also irradiated onto the cathode electrode 222 of the field electron emission source provided in the focusing cup 212, and adsorbing materials of the cathode electrode 222 and outgassing are removed by the irradiation of the electron beam 1.

Specifically, in the manufacturing process of the x-ray tube 200, the x-ray tube 200 allows a high current to flow in the emitter by applying a voltage to the gate electrode 221. The high current allows Joule heat to be generated from a surface of the emitter, thereby desorbing and removing water adsorbed onto the surface of the emitter. At this time, in order to prevent degradation of the emitter due to the Joule heat, a current having a short pulse may flow in the gate electrode 221.

In the driving of the x-ray tube 200, the outgassing may be removed by the shared getter 213. To this end, the x-ray tube 200 is sealed after the getter 213 is activated.

As described above, the x-ray tube 200 sufficiently removes outgassing, so that it is possible to prevent the outgassing from excessively occurring even when the electron beam 1 and the x-ray 2 collide with an internal component such as the anode electrode 232 or the cathode electrode 222 in the driving of the x-ray tube 200. Accordingly, it is possible to minimize the degradation of a vacuum degree due to the outgassing and to improve the performance and lifespan of the x-ray tube 200.

FIG. 4 is a view illustrating a structure of an x-ray tube according to a second embodiment of the present disclosure.

In the second embodiment of the present disclosure, a hybrid electron emission source 310 including both a thermal electron emission source and a field electron emission source has the following structure.

The thermal electron emission source and the field electron emission source share a focusing cup 312 with each other. To this end, the field electron emission source is disposed in the focusing cup 312 of the thermal electron emission source. As the field electron emission source is disposed in the focusing cup 312, the field electron emission source may share a getter 313 with the thermal electron emission source.

In the second embodiment of the present disclosure, the thermal electron emission source may be disposed over the field electron emission source. Specifically, a cathode 311 of the thermal electron emission source may be disposed over the focusing cup 312. That is, the cathode 311 of the thermal electron emission source is disposed over the field electron emission source on the basis of the focusing cup 312. To this end, the thermal electron emission source may have a circular band shape. In this case, a hole through which electron beams emitted from the field electron emission source and the thermal electron emission source pass may be formed in the focusing cup 312. The cathode 311 of the thermal electron emission source and the field electron emission source may be arranged opposite to each other with the hole formed in the focusing cup 312, which is interposed therebetween.

In the hybrid electron emission source 310 having the structure according to the second embodiment of the present disclosure, an electron beam 1 emitted from the heated thermal electron emission source is also irradiated onto a cathode electrode 322 of the field electron emission source, which is provided in the focusing cup 312, so that adsorbing materials of the cathode electrode 322 and outgassing can be sufficiently removed.

In the second embodiment of the present disclosure, other components of the x-ray tube 300 and their effects are the same as described in the first embodiment.

FIG. 5 is a view illustrating a structure of an x-ray tube according to a third embodiment of the present disclosure.

In the third embodiment of the present disclosure, a hybrid electron emission source 410 including both a thermal electron emission source and a field electron emission source has the following structure.

The thermal electron emission source and the field electron emission source share a focusing cup 412 with each other. To this end, the field electron emission source is disposed in the focusing cup 412 of the thermal electron emission source. As the field electron emission source is disposed in the focusing cup 412, the field electron emission source may share a getter 413 with the thermal electron emission source.

In the third embodiment of the present disclosure, the thermal electron emission source may be disposed under the field electron emission source. Specifically, a cathode 411 of the thermal electron emission source may be disposed under the field electron emission source. That is, the cathode 411 of the thermal electron emission source is disposed under a cathode electrode 422 of the field electron emission source. In this case, a hole through which electron beams emitted from the field electron emission source and the thermal electron emission source pass may be formed in the focusing cup 412.

In the hybrid electron emission source 410 having the structure according to the third embodiment of the present disclosure, an electron beam 1 emitted from the heated thermal electron emission source is also irradiated onto the field electron emission source provided in the focusing cup 412, to locally heat the field electron emission source to a high temperature. Accordingly, so that adsorbing materials of the cathode electrode 422 and outgassing can be sufficiently removed.

As described above, in the related art, there is a problem in that outgassing of the x-ray tube 100 cannot be removed at a sufficiently high temperature due to the limitation of the softening temperature of the glass tube forming the outer shape of the x-ray tube 100. However, according to the third embodiment of the present disclosure, since the thermal electron emission source is disposed under the field electron emission source, heat is not conducted to the glass tube by the components including the field electron emission source even though a temperature higher than the softening temperature of the glass tube is supplied to the thermal electron emission source. Thus, outgassing can be more efficiently removed through local high-temperature heating.

In the third embodiment of the present disclosure, other components of the x-ray tube and their effects are the same as described in the first embodiment.

According to the present disclosure, in the x-ray tube including the hybrid electron emission source, the hybrid electron emission source includes both the field electron emission source and the thermal electron emission source, so that the electron emission sources can be selectively used according to when a high-density x-ray is required or when high-speed scanning is required.

Also, the x-ray tube has a structure in which the hybrid electron emission source can sufficiently remove outgassing that occurs in internal components, so that it is possible to prevent the degradation of a vacuum degree in the driving of the x-ray tube and to improve the performance and lifespan of the x-ray tube.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. An x-ray tube comprising:
   an electron emission source emitting an electron beam; and
   a target part including a target material that emits an x-ray as the emitted electron beam collides with the target part,
   wherein the electron emission source includes a thermal emission source and a field emission source, and emits the electron beam by selectively using at least one of the thermal emission source and the field emission source.

2. The x-ray tube of claim 1, wherein the thermal emission source includes:
   a cathode to which a coil-shape tungsten filament is connected;
   a focusing cup surrounding the periphery of the cathode, the focusing cup focusing an electron beam emitted from the cathode; and
   a getter provided in the focusing cup, the getter removing outgassing that occurs in the x-ray tube by adsorption of the outgassing.

3. The x-ray tube of claim 2, wherein the field electron emission source includes:
   a gate electrode forming an electric field; and
   a cathode electrode including an emitter that emits electrons induced by the electric field.

4. The x-ray tube of claim 3, wherein the target part includes an anode electrode including the target material.

5. The x-ray tube of claim 4, wherein the field emission source is disposed to share the focusing cup and the getter with the thermal emission source.

6. The x-ray tube of claim 4, wherein the field emission source is disposed in the focusing cup.

7. The x-ray tube of claim 6, wherein the field emission source is disposed beside the thermal emission source.

8. The x-ray tube of claim 6, wherein the field electron emission source is disposed beside the cathode of the thermal emission source in the focusing cup.

9. The x-ray tube of claim 6, wherein the field emission source is disposed inside the focusing cup, and the thermal emission source is disposed outside the focusing cup.

10. The x-ray tube of claim 6, wherein the cathode of the thermal emission source is disposed outside of the focusing cup, and the cathode of the thermal emission source is disposed between the field emission source and the target part.

11. The x-ray tube of claim 6, wherein the field emission source is disposed between the thermal emission source and the target part.

12. The x-ray tube of claim 6, wherein the field emission source is disposed between the cathode of the thermal emission source and the target part.

13. The x-ray tube of claim 6, wherein the electron beam emitted from the thermal electron emission source collides with the target part and a cathode of the field emission source, thereby causing the outgassing that is removed by the getter.

14. The x-ray tube of claim 6, wherein the gate electrode allows a current to flow in the emitter, thereby removing outgassing of the emitter.

15. The x-ray tube of claim 13, wherein the outgassing is removed in a manufacturing process of the x-ray tube.

16. The x-ray tube of claim 6, wherein the getter is activated before the x-ray tube is sealed, to remove the outgassing that occurs during driving of the x-ray tube.

\* \* \* \* \*